(12) United States Patent
Zhao et al.

(10) Patent No.: US 11,728,135 B2
(45) Date of Patent: Aug. 15, 2023

(54) ELECTRIC PRESSURE SYSTEMS FOR CONTROL OF PLASMA PROPERTIES AND UNIFORMITY

(71) Applicant: TOKYO ELECTRON LIMITED, Tokyo (JP)

(72) Inventors: Jianping Zhao, Austin, TX (US); Lee Chen, Cedar Creek, TX (US); Merritt Funk, Austin, TX (US); Zhiying Chen, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 428 days.

(21) Appl. No.: 14/932,057

(22) Filed: Nov. 4, 2015

(65) Prior Publication Data

US 2016/0056018 A1 Feb. 25, 2016

Related U.S. Application Data

(62) Division of application No. 14/206,518, filed on Mar. 12, 2014, now Pat. No. 9,209,032.

(60) Provisional application No. 61/794,073, filed on Mar. 15, 2013.

(51) Int. Cl.
  *H01J 37/32* (2006.01)
  *H01L 21/3065* (2006.01)
  *H01L 21/67* (2006.01)

(52) U.S. Cl.
  CPC .... *H01J 37/32009* (2013.01); *H01J 37/3244* (2013.01); *H01J 37/32532* (2013.01); *H01J 37/32541* (2013.01); *H01J 37/32568* (2013.01); *H01J 37/32642* (2013.01); *H01J 37/32697* (2013.01); *H01J 37/32715* (2013.01); *H01L 21/3065* (2013.01); *H01L 21/67069* (2013.01)

(58) Field of Classification Search
  CPC .................................................. H01J 37/32596
  USPC .................................. 118/723 R; 156/345.45
  See application file for complete search history.

(56) References Cited

U.S. PATENT DOCUMENTS

| | | | | |
|---|---|---|---|---|
| 4,574,179 A | * | 3/1986 | Masuzawa | H01J 37/3056 315/111.81 |
| 5,133,825 A | * | 7/1992 | Hakamata | H01J 37/32357 118/723 MR |
| 5,531,862 A | * | 7/1996 | Otsubo | C23C 14/564 134/1.2 |
| 5,817,534 A | * | 10/1998 | Ye | H01J 37/32862 438/10 |
| 5,891,349 A | | 4/1999 | Tobe et al. | |
| 6,124,003 A | * | 9/2000 | Mikami | C23C 16/486 118/723 FI |

(Continued)

*Primary Examiner* — Jeffrie R Lund
*Assistant Examiner* — Tiffany Z Nuckols
(74) *Attorney, Agent, or Firm* — Weihrouch IP (57) ABSTRACT

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate. This disclosure relates to a plasma processing system for controlling plasma density near the edge or perimeter of a substrate that is being processed. In one embodiment, the plasma density may be controlled by reducing the rate of loss of ions to the chamber wall during processing. This may include biasing a dual electrode ring assembly in the plasma chamber to alter the potential difference between the chamber wall region and the bulk plasma region.

19 Claims, 8 Drawing Sheets

(56) References Cited

U.S. PATENT DOCUMENTS

| | | | |
|---|---|---|---|
| 6,184,489 B1* | 2/2001 | Ito | H01J 37/32431 118/723 R |
| 6,238,512 B1 | 5/2001 | Li et al. | |
| 6,361,661 B2* | 3/2002 | Hong | C23C 14/3407 204/192.12 |
| 6,476,399 B1* | 11/2002 | Harrington | H01J 37/3171 250/398 |
| 2003/0150562 A1 | 8/2003 | Quon | |
| 2003/0168588 A1* | 9/2003 | Brailove | H01J 49/284 250/281 |
| 2005/0016838 A1* | 1/2005 | Murata | H01J 27/16 204/192.32 |
| 2005/0214477 A1* | 9/2005 | Hanawa | C23C 16/402 427/569 |
| 2005/0260354 A1* | 11/2005 | Singh | H01J 37/32412 427/523 |
| 2007/0023398 A1* | 2/2007 | Kobayashi | H01J 37/32027 219/69.12 |
| 2008/0110747 A1* | 5/2008 | Ding | C23C 14/358 204/192.17 |
| 2008/0135518 A1* | 6/2008 | Chen | H01J 37/32587 216/67 |
| 2008/0142481 A1* | 6/2008 | White | C23C 16/4401 216/67 |
| 2008/0180357 A1* | 7/2008 | Kawakami | H01J 37/32091 345/60 |
| 2009/0242127 A1* | 10/2009 | Koshimizu | H01J 37/32091 156/345.28 |
| 2012/0037597 A1 | 2/2012 | Koshimizu et al. | |
| 2014/0273538 A1* | 9/2014 | Chen | H01J 37/32697 438/798 |

* cited by examiner

ELECTRIC PRESSURE SYSTEMS FOR CONTROL OF PLASMA PROPERTIES AND UNIFORMITY

CROSS REFERENCE TO RELATED APPLICATIONS

This application claims the benefit of and priority to prior filed co-pending U.S. application Ser. No. 14/206,518 filed Mar. 12, 2014 and Provisional Application Ser. No. 61/794,073 filed Mar. 15, 2013, the entire contents of which are expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Plasma uniformity control during plasma processing for treating semiconductor substrates is important to achieve patterning structures on a substrate or controlling the amount of material removed from or deposited on or into the substrate. A plasma processing system may include a large distance or gap between the plasma source and the substrate. A chamber wall of the plasma processing may be disposed between the plasma source and the substrate. As a result, ions and electrons in the plasma may be influenced by the potential difference between the plasma and the chamber wall. The ions proximate to the chamber wall may migrate towards the chamber wall instead of the substrate. The loss of ions to the chamber wall may alter the plasma density profile across the substrate that may introduce processing non-uniformities that may negatively impact semiconductor devices being built in or on the substrate. For example, a lower plasma density at the edge of the substrate may induce a lower etch or deposition rate at the edge of the substrate than at the center of the substrate. Hence, systems and methods that improve plasma density profile uniformity may be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more plasma sources that can emit electromagnetic energy to ionize gas that is delivered via a gas delivery system. The distance between the plasma and the substrate may sufficiently confine the charted particles in the plasma to enable a uniform plasma density. The charged particles may be attracted to chamber wall that prevent charged particles from reaching the substrate, particular at substrate edge region. The loss of the charge particles to such as boundary or chamber wall may result in plasma density non-uniformity that leads to substrate processing non-uniformity.

One approach to minimizing charged particle (e.g., ions) loss may be to alter the boundary potential at the chamber wall in a way that may push the charged particles away from the chamber wall. In other words, building a potential difference proximate to the chamber wall may generate an electric pressure that prevents most charged particles from being lost to the chamber wall. The electric pressure pushes the ions away from the chamber wall. The boundary potential may be altered by including two ring electrodes, or their equivalents, that may be disposed between the plasma source(s) and the substrate. The two ring electrodes may be coupled together via a power source (e.g., direct current, radio frequency, etc.). The boundary potential or plasma sheath at the chamber wall may be altered by this arrangement in way that generates a sheath conditions that enable the electric pressure concept described above.

The multi-ring assembly design may be used with other plasma sources in a plasma processing chamber to reduce plasma density non-uniformity. The plasma source(s) may include, but is not limited to, inductive coupling sources, microwave sources, radio frequency sources, or a combination thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
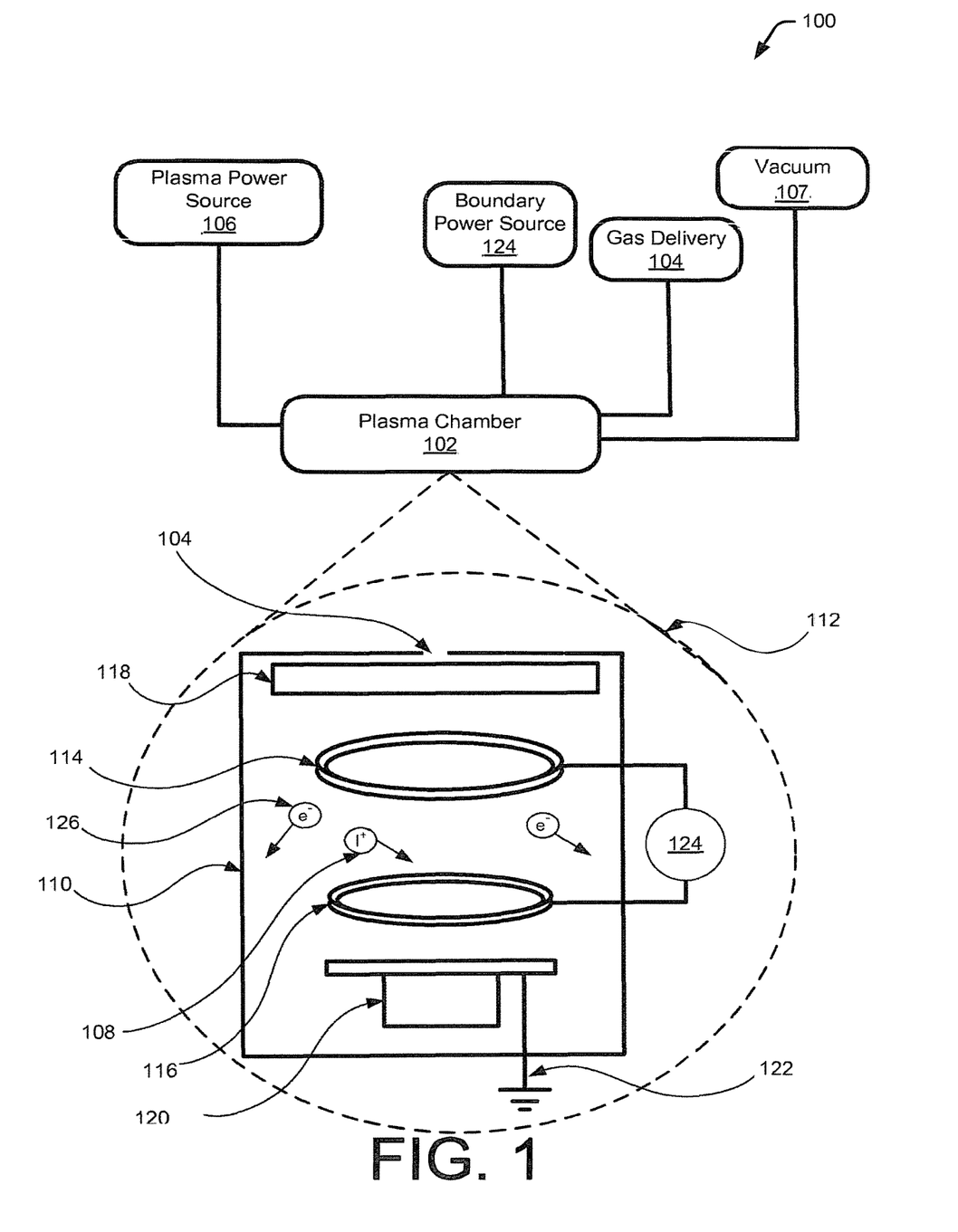
FIG. 1 is an illustration of a representative embodiment of a plasma processing system that shows a schematic cross-sectional illustration of a plasma chamber that includes a perspective view of a ring electrode assembly.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a plasma power source 106. A vacuum system 107 may also maintain a sub-atmospheric pressure within the plasma chamber 102 during plasma generation.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas may increase the density of ionized molecules within the gas, such that the ionized molecules may be influenced by potential differences within the plasma chamber 102. For example, the potential differences within the plasma chamber 102 may direct the ionize molecules towards a substrate (not shown). The ionized molecules 108 may interact with the substrate or treat the substrate in a way that may remove a portion of the substrate or may be deposited unto the substrate. In this way, patterns may be etched into the substrate or films may be deposited onto the substrate.

Plasma density across the plasma chamber 102 may impact the uniformity of the plasma treatment of the substrate. The plasma density may be ion molecule 108 density within a volume within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of ion loss to the chamber wall 110, specifically for wide gap between plasma source and substrate. One approach to resolve the non-uniformity may be to alter or generate a sheath or boundary potential (not shown) at the chamber wall 110. A detailed view 112 illustrates one embodiment of this approach in the plasma chamber 102.

In one embodiment, the sheath or boundary potential may be altered by using a ring electrode assembly comprising a first ring electrode 114 and the second ring electrode 116 disposed between the plasma source electrode 118 and the substrate holder 120 that may be coupled to ground 122. The plasma source electrode 118 may include, but is not limited to, inductive coupling sources, microwave sources, radio frequency sources, hallow cathode plasma, alternating or direct current sources, or a combination thereof.

The ring assembly may also include a boundary potential source 124 that may be used to influence the boundary potential (not shown) along the chamber wall 110. The boundary potential will be discussed in greater detail in the description of FIG. 3. In short, the boundary potential may generate a sheath voltage that attracts electrons 126 to a region proximate to the chamber wall 110. This boundary potential formed by electrons 126 may be used to push or repel ions 108 away from the chamber wall 110 and may improve the plasma density uniformity across the substrate holder 120. The improvement in uniformity may be due to reducing the rate of ion 108 loss to the chamber wall 110. In this way, the ion 108 density proximate to the edge of the substrate holder 120 may be higher than without using the ring electrode assembly. In another embodiment, the second ring electrode 116 may be located adjacent to the substrate holder 122 during plasma processing. The positioning of the second ring electrode 116 is not intended to be limited to the embodiment shown in or described in the description of FIG. 1.

Figure 2:
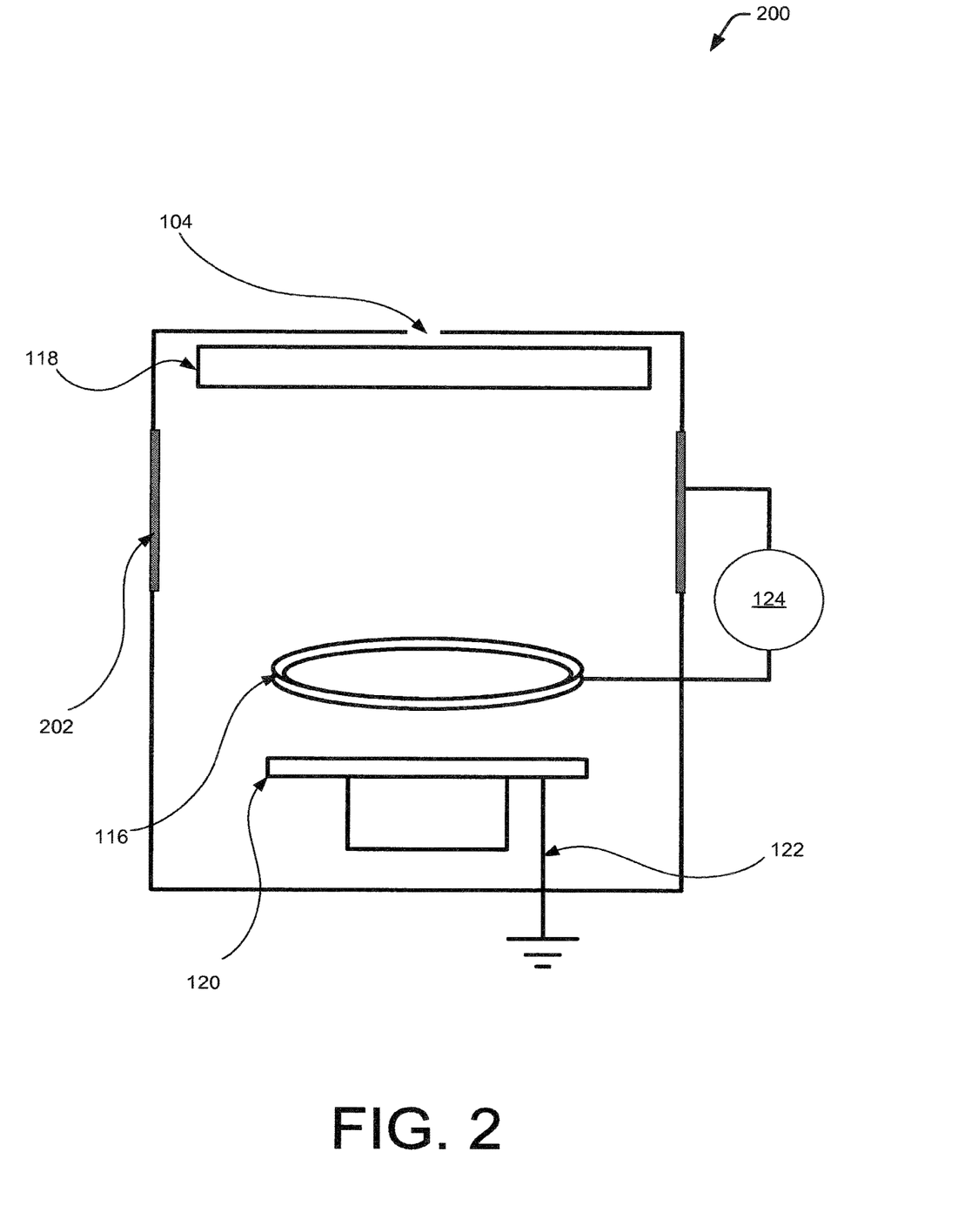
FIG. 2 is another illustration of a cross section a plasma chamber that incorporates the chamber wall in to the ring electrode assembly.

FIG. 2 is another illustration 200 of a cross section of another embodiment of the ring electrode assembly that may be incorporated into the plasma chamber 102. In plasma processing systems, the layout of the chamber may be impacted by gas flow considerations, in addition to the plasma generation considerations. Hence, being able to reduce the amount of obstructions for gas flow in the plasma chamber 102 may be desirable. The components of the plasma chamber 102 may be placed or designed to limit interference with gas flow.

In the FIG. 2 embodiment, the first ring electrode 114 may be incorporated into the chamber wall 110 to minimize the obstruction of gas or plasma flow within the plasma chamber 102. The wall electrode 202 may be electrically isolated from the remainder of the chamber wall 110. This configuration may enable the application of a potential to the wall electrode 202 by the boundary power source 124 without charging non-wall electrode portions of the chamber wall 110. The wall electrode 202 may operate in a similar manner as the first ring electrode 114 as described in the description of FIG. 1. In that the wall electrode 202, in conjunction with the second electrode 116, may induce a negative sheath potential proximate to the chamber wall 110.

The formation of the sheath or boundary potential layer (not shown) along the chamber wall 110 may be the result of a thin region of electric fields (not shown) between the chamber wall 110 and the bulk plasma potential (not shown). The potential drop across thin region is relatively sharp compared to the distribution of the bulk potential voltage; this will be shown and described in the description of FIGS. 3A-3D.

In FIGS. 3A-3D, the change of the potential profile in the plasma chamber 102 can be varied by using different power sources powering the ring at different locations. The varying power to the first electrode 114 or 202, pressure, and other plasma conditions can result in varying potential profiles due to secondary electron emission emitted from the first electrode 114 or 202 and/or the second electrode 116. The potential difference between boundary sheath potential and bulk plasma potential may be adjusted so that the potential profiles illustrated in FIGS. 3A-3D. In another embodiment, if a localized field or secondary localized plasma potential from a localized plasma source was formed by a ring structure similar to the first electrode 114 adjacent to the wall, a potential profile similar to FIG. 3C may form, in which a localized high potential is formed in between bulk plasma potential and the boundary sheath potential.

Figure 3A:
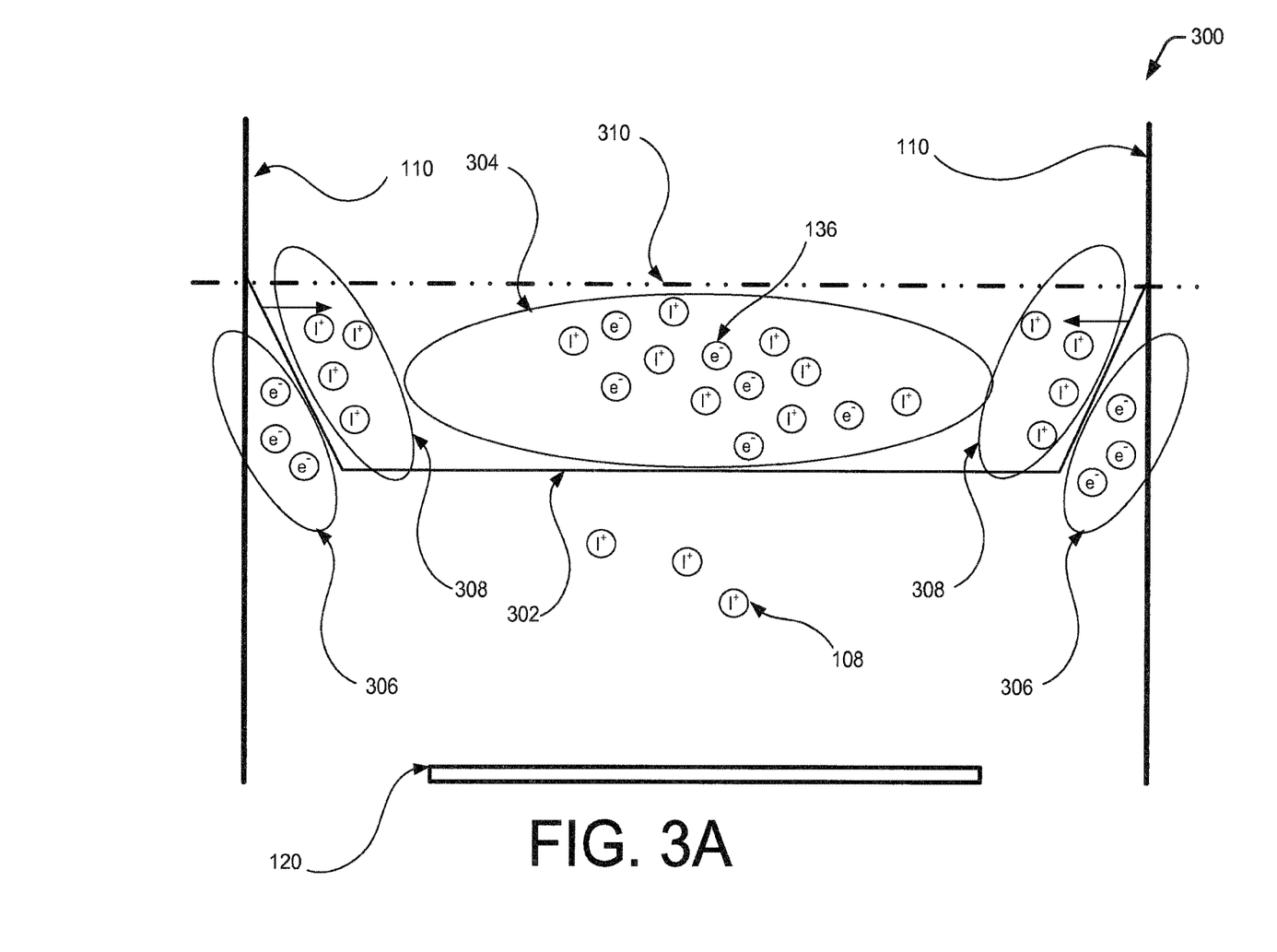
FIG. 3A is an illustration of a cross section of the plasma chamber with a plasma potential profile in the plasma chamber that may be enabled by the ring electrode assembly.

FIG. 3A is an illustration 300 of a cross section of the plasma chamber 102 with a plasma potential profile 302 that may be enabled by the ring electrode assembly of FIG. 1 or FIG. 2. Generally, the plasma potential profile 302 may be inverted during plasma processing without the ring electrode assembly to form a positive plasma potential profile (not shown). The illustrated plasma potential profile 302 may be referred to as a negative plasma potential profile 302, in that the potential of the bulk plasma region 304 may have a greater negative potential than the potential at or near the chamber wall 110. The sheath potential being measured from a voltage reference line 310 that may represent the potential reference value for the chamber wall 110 and the potential at the bulk plasma region 304.

The negative bulk plasma potential may be enabled by the boundary power supply 124 by applying a negative voltage to the first ring electrode 114 and connecting the second ring electrode 116 to the ground of the boundary power supply 124. The potential from the ring electrode assembly (e.g., first ring electrode 114, second ring electrode 116, etc.) may assist in generating the negative bulk potential region 304 and the boundary sheath region 306 by attracting electrons 126 to the chamber wall 110. At least a majority of the ions 108 adjacent to the sheath regions 306 may be repelled or pushed away from the boundary sheath regions 306. In other words, an electric pressure force may be emitted from the chamber wall 110 towards the bulk plasma region 304 that may prevent the ions 108 from being lost from the bulk plasma region 304 to the chamber wall 110. The repelling or electric pressure is illustrated by the two arrows pointing from the chamber wall 110 towards the bulk potential region 304. The rate of ion 108 loss to the chamber wall 110 may be reduced, but may not be completely eliminated by the boundary sheath regions 306. The lower rate of ion 108 loss may increase the ion density in a region proximate to the chamber wall 110 and may result in a higher number of ions 108 that may be used to treat the edges of the substrate.

In one embodiment, the boundary sheath regions 306 may be relatively thin compared to the bulk potential region 304. The bulk potential region 304 may be used to treat semiconductor substrates for etching, deposition, ion implant, and the like. In one specific embodiment, the semiconductor substrate may be circular and have a diameter of at least 200 mm. Accordingly, the boundary sheath region 306 thickness may be substantially smaller than the substrate diameter by at least two orders of magnitude. The horizontal thickness of the boundary sheath region 306 may be based on the plasma process conditions which may vary based, at least in part, on electron density, ion temperature (Ti), and electron temperature (Te). The horizontal thickness may be measured from the chamber wall 110 to a horizontal distance away from the chamber wall where the plasma potential profile relatively constant compared to the change in potential proximate to the chamber wall 110.

Figure 3B:
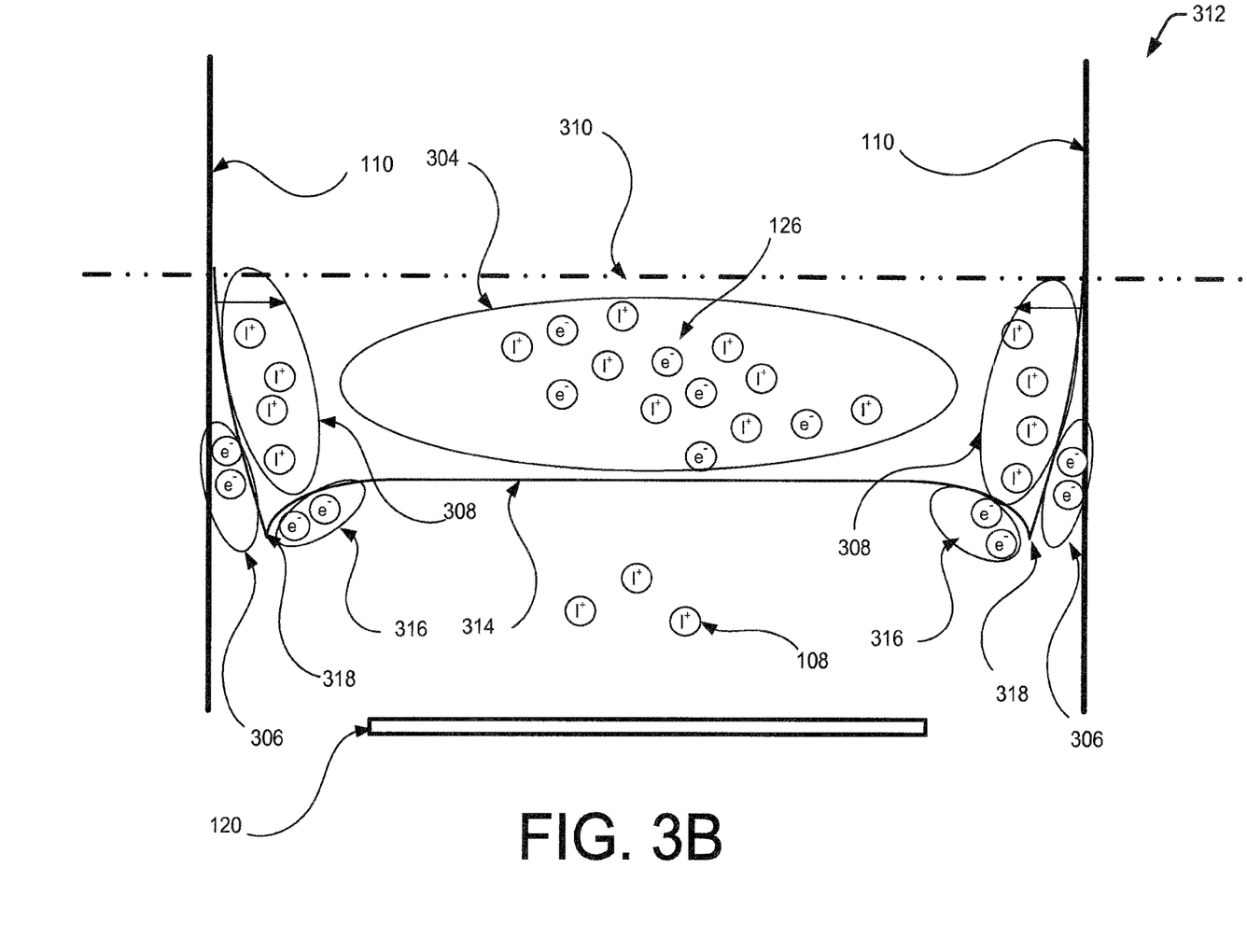
FIG. 3B is an illustration of a cross section of the plasma chamber with a plasma potential profile in the plasma chamber that may be enabled by the ring electrode assembly.

FIG. 3B is an illustration 312 of a cross section of the plasma chamber with a negative dip plasma potential profile 314 in the plasma chamber 102 that may be enabled by the ring electrode assembly. The negative dip plasma potential profile 314 may include a secondary boundary region 316 that may include electrons that are isolated from the boundary sheath region 306 by a potential dip 318 in the negative dip plasma potential profile 314.

Figure 3C:
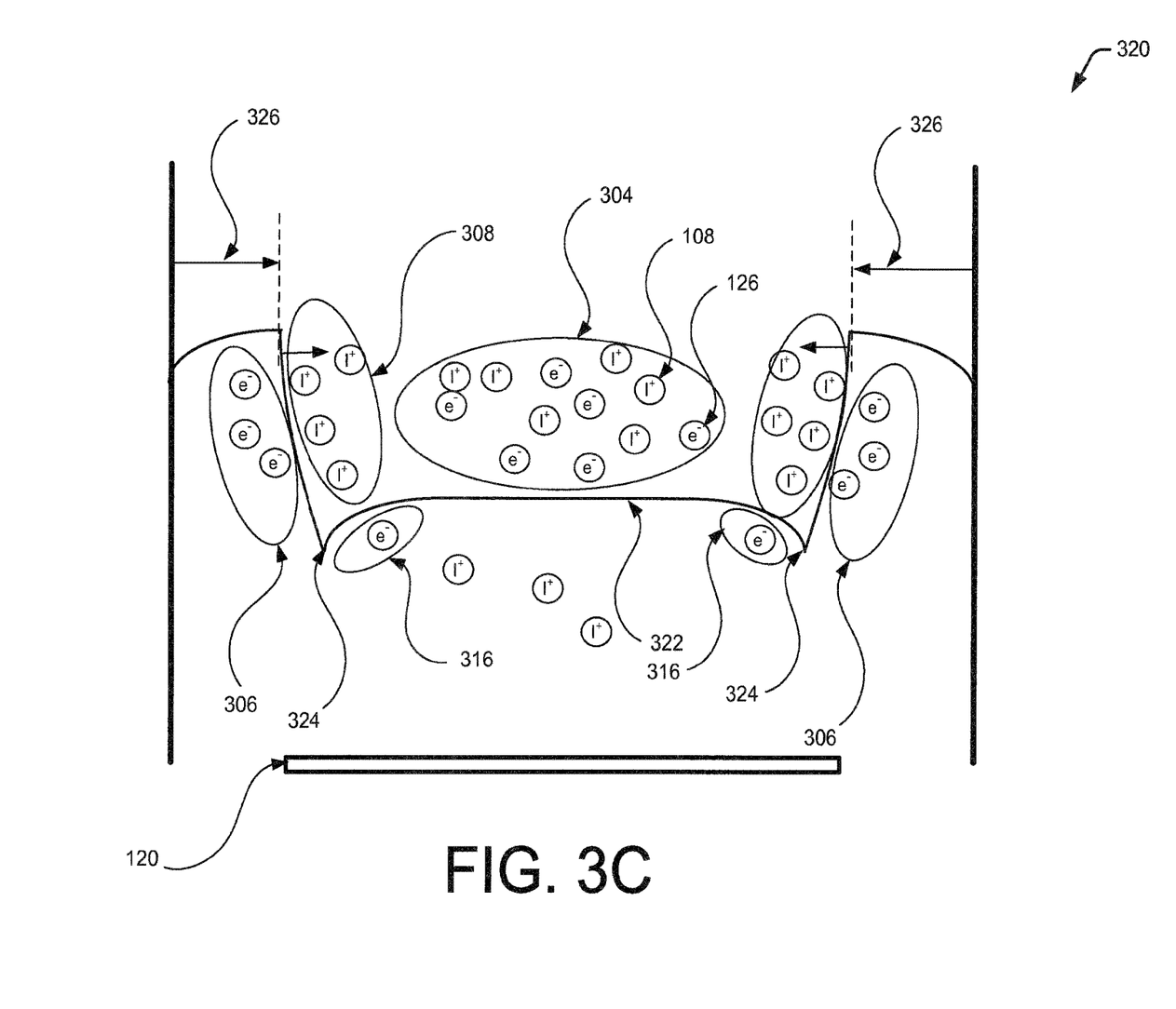
FIG. 3C is an illustration of a cross section of the plasma chamber with a plasma potential profile in the plasma chamber that may be enabled by the ring electrode assembly.

FIG. 3C is an illustration 320 of a cross section of the plasma chamber 102 with a negative double layer plasma potential profile 322 in the plasma chamber that may be enabled by the ring electrode assembly. The negative double layer plasma potential profile 322 may include a potential dip 324 similar to the potential dip 318 in FIG. 3B, but the location of the potential dip 324 may offset from the chamber wall 110 by a potential gap distance 326. In short, the potential gap distance 326 may enable the ions 308 to be at a higher density and further away from the chamber wall 110 than shown in the FIGS. 3A-3B embodiments.

Figure 3D:
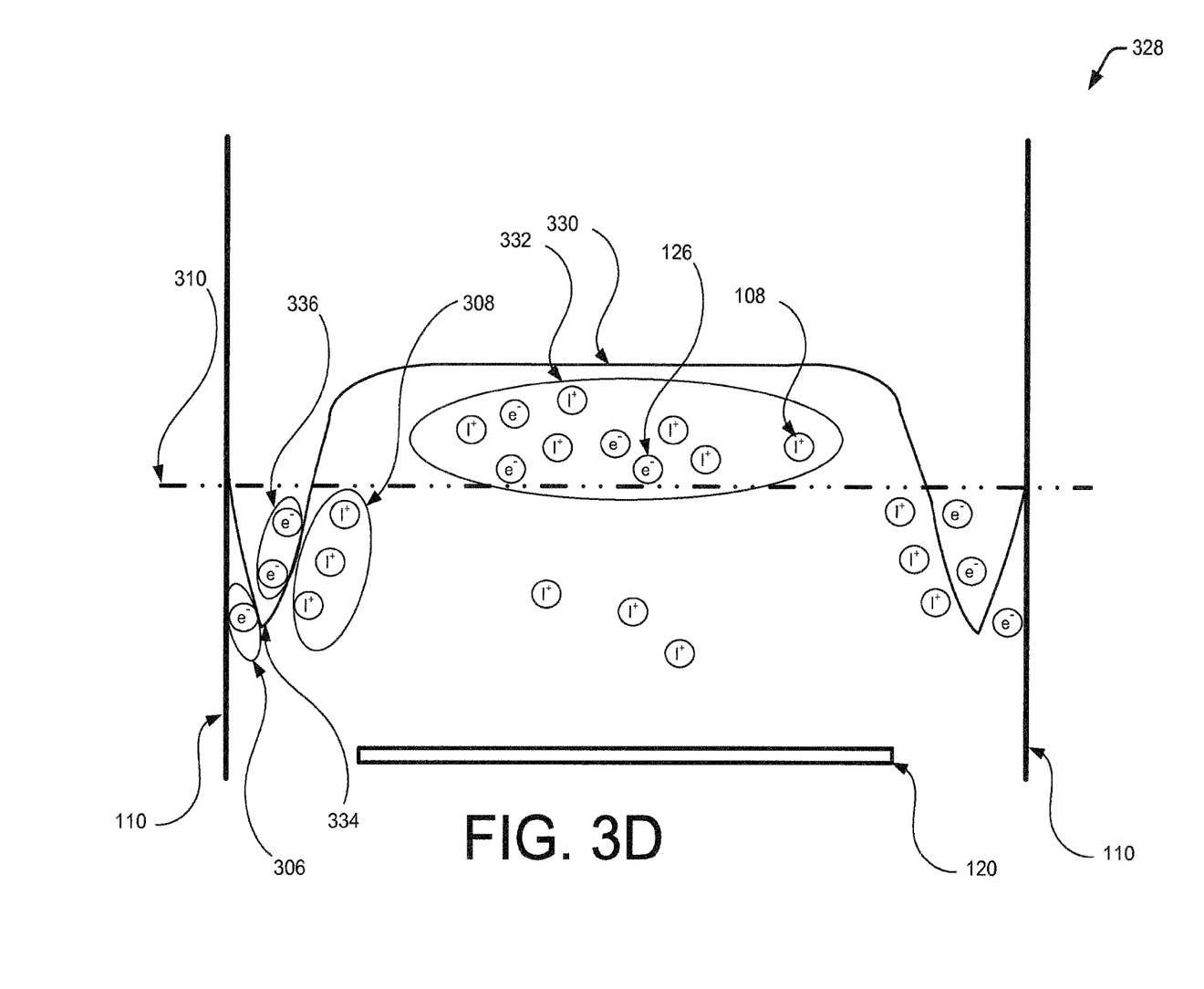
FIG. 3D is an illustration of a cross section of the plasma chamber with a plasma potential profile in the plasma chamber that may be enabled by the ring electrode assembly.

FIG. 3D is an illustration 328 of a cross section of the plasma chamber with a negative-positive double sheath plasma potential profile 330 in the plasma chamber 102 that may be enabled by the ring electrode assembly. The negative double sheath plasma potential profile 330 may have a bulk potential region 332 that has a positive potential compared to the boundary sheath region 306. This is in contrast to the bulk potential regions 304 in FIGS. 3A-3C. The negative-positive double sheath plasma potential profile 330 may also include a potential dip 334 that enables a lower secondary boundary layer 336 to form between the boundary sheath region 306 and the bulk potential region 332, as shown in FIG. 3D.

Figure 4:
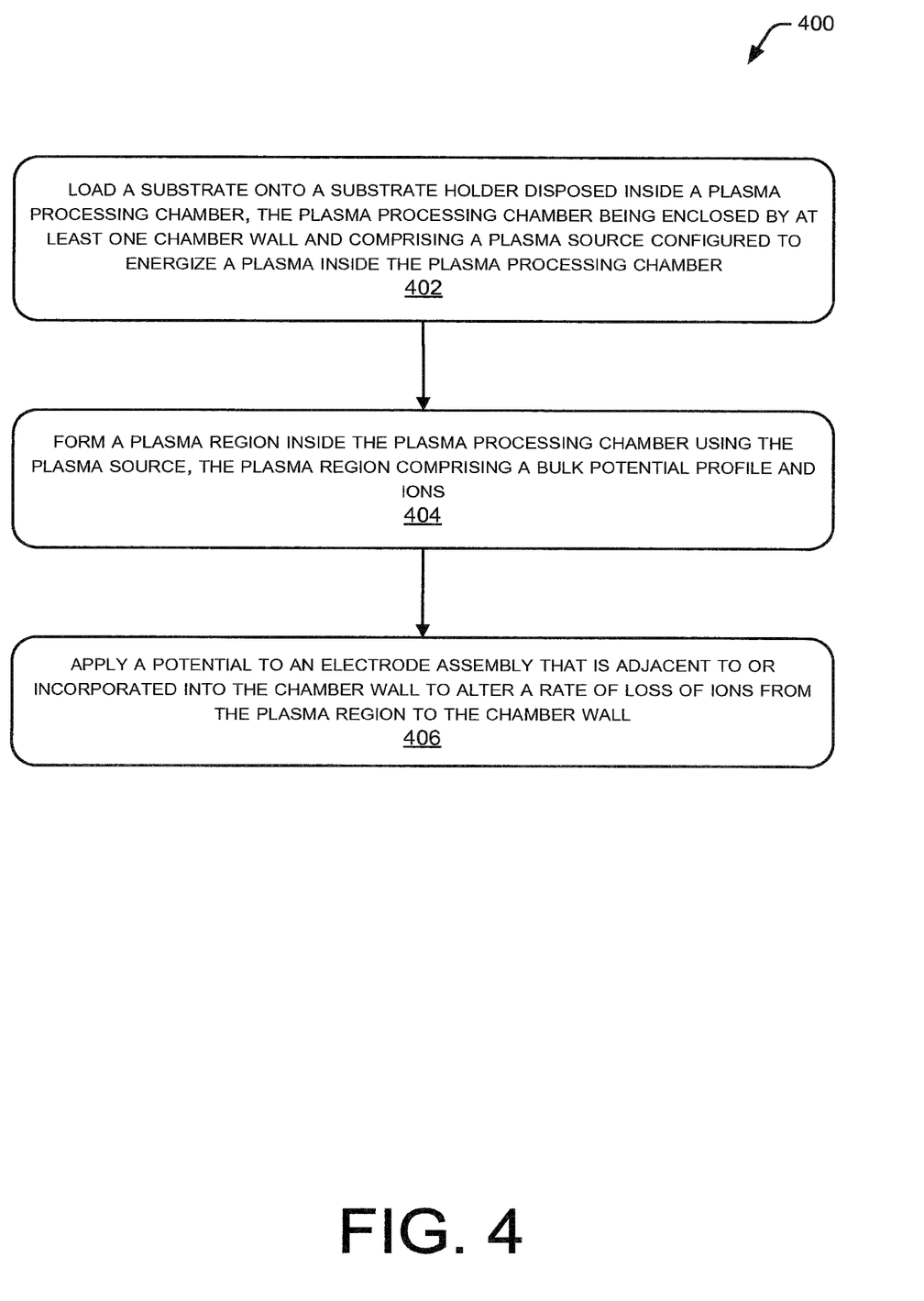
FIG. 4 is a flow diagram for a method for implementing a boundary potential profile in the plasma chamber that minimizes ion loss from the plasma to the chamber wall.

FIG. 4 is a flow diagram 400 for a method for implementing a boundary potential profile in the plasma chamber 102 using the ring electrode assembly to minimize ion 108 loss from the bulk plasma region 304 to the chamber wall 110. The first ring electrode 114 or 202 and the second ring electrode 116 may be used in conjunction with the boundary power supply 124 to generate a boundary sheath potential region 306 along the chamber wall 110 that prevents at least a majority of the ions 108 from reaching the chamber wall 110.

At block 402, the plasma chamber 102 may receive a substrate that may be placed onto a substrate holder that is disposed within the plasma chamber 102. The plasma chamber 102 may be enclosed by at least one chamber wall 110. To generate plasma, the plasma chamber 102 may also include a plasma source 118 configured to generate plasma using one or more gases that may be provided to the plasma chamber 102 via a gas delivery system 104. The vacuum system 108 may also be used to vary the pressure within the plasma chamber 102 and evacuate gas or particulates generated during substrate treatment.

At block 404, the plasma source 118 may receive power from the plasma power source 106 and plasma may be formed inside the plasma chamber 102. The plasma may include several regions that may include different plasma density characteristics. One way to illustrate the plasma characteristics may be a region comprising a plasma potential profile 302 that may include a bulk plasma region 304 and the boundary sheath region 306. The bulk plasma region 304 may be proximate to the interior region of the plasma chamber 102 and the boundary sheath region 306 disposed between the chamber wall 110 and the bulk plasma region 304. However, the plasma potential profile (e.g., positive potential profile, see FIG. 5) may induce ion 108 loss to the chamber wall 110. Accordingly, the plasma density will be higher near the center of the plasma chamber than the periphery of the plasma chamber 102. This may lead to non-uniform processing of the substrate, whether the process is etching, depositing, implanting, or combination thereof.

One approach to minimize ion 108 loss to the chamber wall 110 may be to invert the positive plasma potential profile to form a negative plasma potential profile, as shown in FIG. 3. The negative plasma potential profile may form a sheath boundary region by attracting electrons in a way that repels or pushes ions 108 away from the chamber wall 110. In one embodiment, the plasma chamber 102 may include a first electrode 114 or 202 and a second electrode 116 that are coupled to a potential source 124.

At block 406, the potential source 124 may apply a potential to an electrode assembly that incorporates the first electrode 114 or 202 and the second electrode 116 to generate the negative plasma potential profile shown in FIG. 3. The applying of the potential comprises forming a negative electron sheath (e.g., boundary sheath region 306) proximate to the chamber wall 110, the negative electron sheath comprising a positive potential region (e.g., boundary sheath region 306) proximate to the chamber wall 110 that may be at a higher potential than the bulk potential region 304.

In one embodiment, the first ring electrode 114 may be adjacent to or incorporated into the chamber wall 110 to alter the rate of loss of ions from the plasma region (e.g., bulk plasma region 304). The location of the first ring electrode 114 may be between the plasma source 118 and the substrate holder 120. The second ring electrode 116 may be disposed below the first ring electrode 114 and above or adjacent to the substrate holder 120. In one specific embodiment, the second ring electrode 116 comprises a focus ring surrounding the substrate holder 120. The focus ring may be designed to control the flow of plasma near the edge of the substrate and/or a portion of the backside of the substrate that may also be exposed to the plasma when positioned in the substrate holder 120. The second ring electrode 116 may be coupled to the ground terminal of the boundary power supply 124. The first ring electrode 114 or 202 may be coupled to a power output terminal of the boundary power supply 124.

The boundary power source 124 that may be coupled to the first ring electrode 114 or 202 and the second ring electrode 116 may be of a variety of power sources. The ring electrode materials may include, but are not limited to, quartz, silicon, ceramic, metal coated with ceramic, and/or carbon based materials. One purpose of the boundary power source 124 may be to impart a positive charge to the ring electrode assembly to attract electrons from the plasma. The boundary power source 124 may include, but is not limited to, a continuous wave or a pulsed DC power source, an alternating current (AC) or a low-frequency radio frequency (RF) power from an RF power supply having a first terminal connected to the first ring electrode 114 or 202 and a second terminal connected to the second ring electrode 114. In one embodiment, the potential provided by the boundary power supply may be between 250V and 500V. In another embodiment, the potential may be at least 200V or less than 500V. In another embodiment, the potential may be more than 500V or less than 200V.

Figure 5:
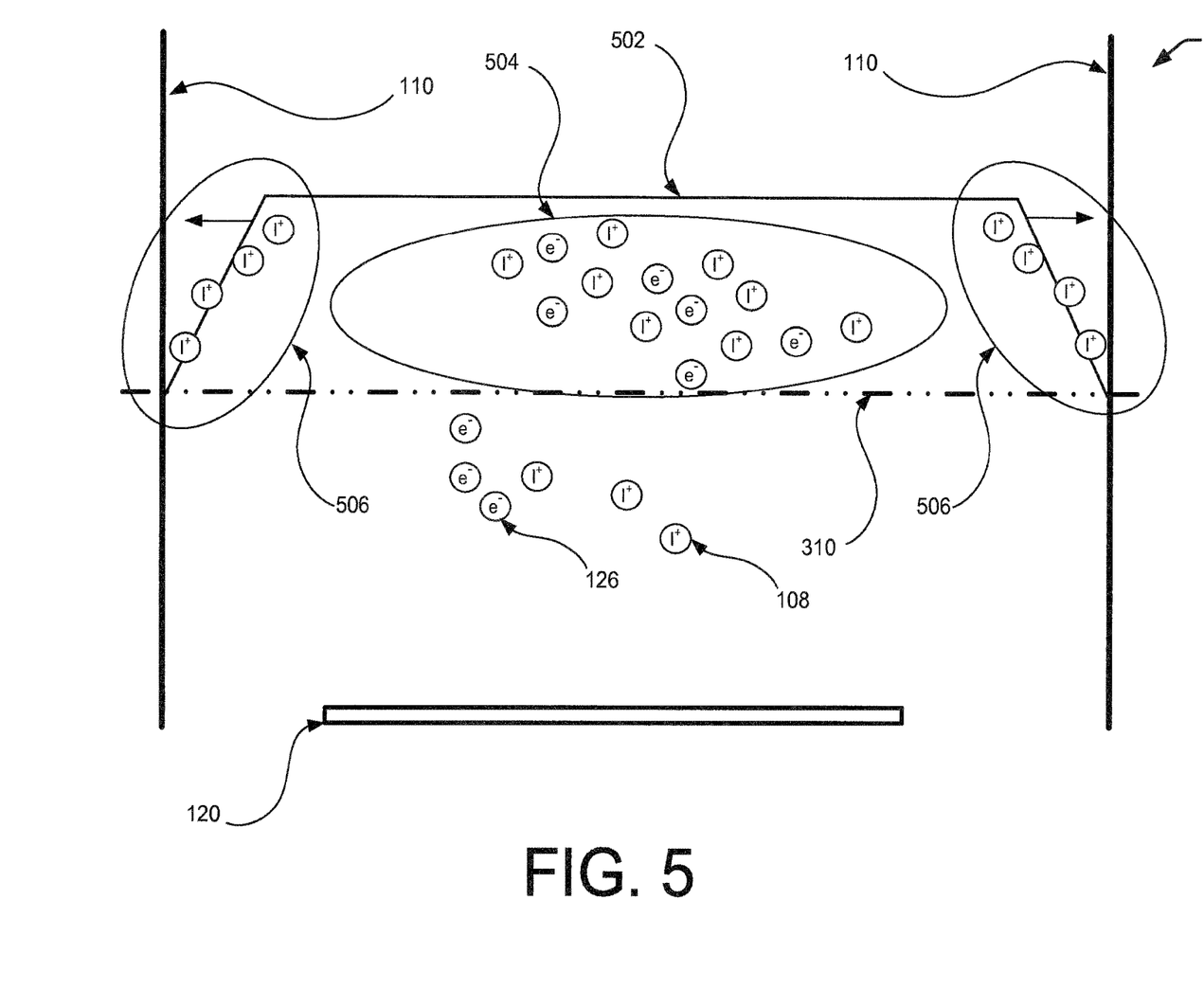
FIG. 5 is an illustration of a cross section of the plasma chamber with a positive plasma potential profile in the plasma chamber.

FIG. 5 is an illustration of a cross section 500 of the plasma chamber 102 with a positive plasma potential profile 502 that may be enabled when the ring assembly in FIG. 1 or FIG. 2 may not be used. The potential reference line 310 may be used as a reference to quantify the plasma potential across the plasma chamber 102. The positive potential profile 502 represents the potential of the positive bulk plasma region 504 that may be generated by one or more plasma sources 118 in or coupled to the plasma chamber 102. Although the regions of the positive potential profile 502 are shown as linear, in other embodiments, the plasma potential profile may also include non-linear regions to reflect non-linear conditions within the plasma.

One concern with the positive bulk plasma region 504 is due to the attraction of the relatively higher potential ions 108 to the chamber wall 110 that may be at a lower potential than the ions 108. Accordingly, the loss of ions 108 to the chamber wall 110 causes a lower plasma density proximate to the edge of the substrate 120. The loss of ions 108 being indicated by the arrows that indicate the ions 108 leaving the positive bulk plasma region 504 and travelling towards the chamber wall 110. The loss of ions to the chamber wall 110 may result in non-uniform process conditions across the substrate, particularly from the center of the substrate 120 to the edge of the substrate 120. As noted above in the description of FIG. 3, biasing the ring assembly in FIG. 1 or 2 may alter the positive plasma potential profile 504 to become a negative plasma potential profile 302. The ion 108 wall loss may be minimized by the formation of the sheath boundary region 306 that may repel or push ions 108 away from the wall.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. An apparatus for treating a substrate, comprising:
   a plasma processing chamber comprising a chamber wall;
   a substrate holder disposed in the processing chamber, for receiving a substrate to be treated;
   a gas delivery system that can supply a gas mixture to the plasma processing chamber, the gas delivery system including an opening into the plasma processing chamber;
   a plasma source electrode disposed within the plasma processing chamber and positioned over the substrate holder, the plasma source electrode being configured to ionize the gas mixture into a plasma in the plasma processing chamber;
   a wall electrode disposed inside the plasma processing chamber and along the chamber wall between the plasma source electrode and the substrate holder;
   a ring electrode disposed away from the chamber wall and having a ring shape in which an outer surface of the ring shape is spaced from the chamber wall, and with respect to a vertical direction, the ring electrode is positioned between the wall electrode and the substrate holder, and wherein the ring electrode is positioned above and spaced from the substrate holder;
   a boundary power supply connected to the ring electrode such that the wall electrode and the ring electrode together form a boundary sheath region that attracts electrons to the chamber wall, the electrons repelling ions away from the boundary sheath region, thereby reducing ion loss to the chamber wall, wherein the boundary power supply is configured to provide a negative voltage to the ring electrode.

2. The apparatus of claim 1, wherein the boundary power supply comprises one of a DC, AC, or low frequency RF power source connected to both the wall electrode and the ring electrode.

3. The apparatus of claim 1, further comprising a plasma power source configured to supply power to the plasma source electrode.

4. The apparatus of claim 1, wherein the wall electrode, the ring electrode, and the boundary power supply are configured to form a plasma potential region spaced from the chamber wall to thereby reduce ion losses to the chamber wall.

5. The apparatus according to claim 1, wherein the wall electrode is mounted to the chamber wall and is electrically isolated from remaining portions of the chamber wall; and wherein the wall electrode, the ring electrode and the boundary power supply are configured to form a negative bulk potential region spaced from the chamber wall and thereby reduce ion losses from plasma formed by the plasma source electrode to the chamber wall.

6. The apparatus according to claim 5, wherein the wall electrode, the ring electrode and the boundary power supply are further configured to form a sheath potential region adjacent to the chamber wall, and the negative bulk potential region has a potential which is more negative than a potential of the sheath potential region.

7. The apparatus according to claim 1, wherein the boundary sheath region includes (i) electrons bordering a first side of the boundary sheath region, and (ii) ions bordering a second side of the boundary sheath region.

8. The apparatus according to claim 1, wherein with respect to a horizontal direction an innermost extent of the wall electrode is outside an outermost extent of the ring electrode, with an outer periphery of the ring electrode inside an inner periphery of the wall electrode, and wherein the wall electrode is mounted to the chamber wall, the ring electrode is within the chamber wall, and the substrate holder is within the chamber wall.

9. The apparatus according to claim 8, wherein the plasma source electrode is positioned within the chamber wall, and wherein with respect to the horizontal direction an outer periphery of the plasma source electrode is between the outer periphery of the ring electrode and the inner periphery of the wall electrode.

10. An apparatus for treating a substrate, comprising:
a plasma processing chamber comprising a chamber wall;
a substrate holder disposed within the chamber wall, for receiving a substrate to be treated;
a gas delivery system for supplying a gas mixture to the processing chamber;
a plasma source electrode for energizing the gas mixture into a plasma in the plasma processing chamber;
a wall electrode disposed in and extending along the chamber wall, and located with respect to a vertical direction between the plasma source electrode and the substrate holder;
a ring electrode disposed in the plasma processing chamber away from the chamber wall and having a ring shape in which an outer surface of the ring shape is within and spaced radially inside from the chamber wall, and wherein a bottom of the ring electrode is positioned above and spaced from a top of the substrate holder; and
a DC power supply with an output terminal connected to the wall electrode and the ring electrode, so that the wall electrode and the ring electrode together form a boundary sheath region that attracts electrons to the chamber wall, the electrons repelling ions away from the boundary sheath region, thereby reducing ion loss to the chamber wall, wherein the DC power supply is configured to provide a negative DC voltage to the ring electrode.

11. The apparatus of claim 10, wherein the DC power supply can apply a voltage having an absolute value of at least 200V.

12. The apparatus of claim 11, wherein the DC power supply can apply a voltage having an absolute value of no more than 500V.

13. The apparatus of claim 10, wherein the DC power supply can apply a voltage having an absolute value of no more than 200V.

14. The apparatus of claim 10, further comprising a plasma power source configured to supply power to the plasma source electrode.

15. The apparatus of claim 10, wherein with respect to the vertical direction, the ring electrode is positioned between the wall electrode and the substrate holder.

16. The apparatus according to claim 15, wherein the wall electrode is mounted to the chamber wall and is electrically isolated from remaining portions of the chamber wall.

17. The apparatus according to claim 16, wherein the DC power supply, the wall electrode and the ring electrode are configured to form a negative bulk potential region spaced from the chamber wall and thereby reduce ion losses to the chamber wall.

18. The apparatus according to claim 10, wherein the boundary sheath region includes (i) electrons bordering a first side of the boundary sheath region, and (ii) ions bordering a second side of the boundary sheath region.

19. The apparatus according to claim 10, wherein:
with respect to the vertical direction, the ring electrode is between the wall electrode and the substrate holder,
with respect to a horizontal direction, an innermost extent of the wall electrode is outside an outermost extent of the ring electrode, with an outer periphery of the ring electrode within an inner periphery of the wall electrode, and
with respect to the horizontal direction an outer periphery of the plasma source electrode is between the outer periphery of the ring electrode and the inner periphery of the wall electrode.

* * * * *